(12) United States Patent
Jayaraman et al.

(10) Patent No.: US 11,367,938 B2
(45) Date of Patent: *Jun. 21, 2022

(54) COUPLER CIRCUIT

(71) Applicant: Skyworks Solutions, Inc., Irvine, CA (US)

(72) Inventors: Srivatsan Jayaraman, Santa Clara, CA (US); Onder Oz, Santa Clara, CA (US); Pradeep A. Balaraman, Cedar Rapids, IA (US); Roman Zbigniew Arkiszewski, Oak Ridge, NC (US); Yeung Bun Choi, Singapore (SG); Songbai Zhang, Singapore (SG)

(73) Assignee: Skyworks Solutions, Inc., Irvine, CA (US)

( * ) Notice: Subject to any disclaimer, the term of this patent is extended or adjusted under 35 U.S.C. 154(b) by 181 days.

This patent is subject to a terminal disclaimer.

(21) Appl. No.: 16/838,366

(22) Filed: Apr. 2, 2020

(65) Prior Publication Data

US 2020/0335844 A1 Oct. 22, 2020

Related U.S. Application Data

(60) Division of application No. 16/172,056, filed on Oct. 26, 2018, now Pat. No. 10,629,979, which is a continuation of application No. 15/712,531, filed on Sep. 22, 2017, now Pat. No. 10,147,994.

(60) Provisional application No. 62/398,705, filed on Sep. 23, 2016.

(51) Int. Cl.
*H01P 5/18* (2006.01)
*H03F 3/24* (2006.01)
*H03G 3/30* (2006.01)
*H03F 3/195* (2006.01)

(52) U.S. Cl.
CPC ............... *H01P 5/18* (2013.01); *H03F 3/195* (2013.01); *H03F 3/24* (2013.01); *H03G 3/3042* (2013.01); *H03F 2200/204* (2013.01); *H03F 2200/294* (2013.01); *H03F 2200/451* (2013.01)

(58) Field of Classification Search
CPC ... H01P 5/18; H03F 3/195; H03F 3/24; H03F 2200/204; H03F 2200/294; H03F 2200/451; H03G 3/3042
See application file for complete search history.

(56) References Cited

U.S. PATENT DOCUMENTS 6,496,708 B1 * 12/2002 Chan ...................... H04B 1/406
455/553.1
7,546,089 B2 * 6/2009 Bellantoni ................ H01P 5/04
455/73
8,289,102 B2 * 10/2012 Yamamoto ................ H01P 5/18
333/116

(Continued)

*Primary Examiner* — Ankur Jain
(74) *Attorney, Agent, or Firm* — Knobbe, Martens, Olson & Bear, LLP

(57) ABSTRACT

Aspects of this disclosure relate to a coupler circuit configured to receive an output of a radio frequency coupler. The coupler circuit can be arranged in a daisy chain with other coupler circuits. The coupler circuit can include a switch configured to turn on based on a signal level of a direct current component of a coupler signal from another coupler circuit and pass a radio frequency component of the coupler signal when on. The coupler circuit can pass the coupler signal while a module that includes the coupler circuit is otherwise inactive.

20 Claims, 9 Drawing Sheets

(56) References Cited

U.S. PATENT DOCUMENTS

| | | | |
|---|---|---|---|
| 8,606,198 B1 | 12/2013 | Wright | |
| 8,699,975 B1* | 4/2014 | Schleicher | H03G 3/3042 |
| | | | 333/109 |
| 9,214,967 B2* | 12/2015 | Reisner | H04B 1/04 |
| 9,331,720 B2 | 5/2016 | Presti | |
| 9,755,670 B2 | 9/2017 | Chen et al. | |
| 9,806,523 B2 | 10/2017 | Stratakos et al. | |
| 10,147,994 B2 | 12/2018 | Jayaraman et al. | |
| 10,629,979 B2 | 4/2020 | Jayaraman et al. | |
| 2007/0008132 A1* | 1/2007 | Bellantoni | H01P 5/04 |
| | | | 340/572.1 |
| 2009/0121776 A1* | 5/2009 | Nagase | H04L 12/40182 |
| | | | 327/434 |
| 2011/0057746 A1* | 3/2011 | Yamamoto | H01P 5/18 |
| | | | 333/116 |
| 2012/0043818 A1* | 2/2012 | Stratakos | H03K 17/145 |
| | | | 307/77 |
| 2012/0113553 A1 | 5/2012 | DuPuis | |
| 2013/0207741 A1 | 8/2013 | Presti | |
| 2014/0267671 A1* | 9/2014 | Kenny | G06T 3/60 |
| | | | 382/128 |
| 2015/0256077 A1* | 9/2015 | Stratakos | H03K 17/122 |
| | | | 307/80 |
| 2015/0349742 A1 | 12/2015 | Chen et al. | |
| 2016/0043458 A1 | 2/2016 | Sun et al. | |
| 2016/0241300 A1 | 8/2016 | Penticoff et al. | |

* cited by examiner

COUPLER CIRCUIT

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application is a divisional of U.S. patent application Ser. No. 16/172,056, filed Oct. 26, 2018 and titled "COUPLER CIRCUIT," which is a continuation of U.S. patent application Ser. No. 15/712,531, filed Sep. 22, 2017 and titled "COUPLER CIRCUIT," which claims the benefit of priority under 35 U.S.C. § 119(e) of U.S. Provisional Patent Application No. 62/398,705, filed Sep. 23, 2016 and titled "COUPLER CIRCUIT," the disclosures of each of which are hereby incorporated by reference in their entireties herein.

BACKGROUND

Technical Field

Embodiments of this disclosure relate to electronic systems and, in particular, to radio frequency circuits.

Description of Related Technology

A radio frequency (RF) coupler can extract a portion of power of an RF signal propagating between ports of the RF coupler. A power detector in communication with an RF coupler can detect a power level of the RF signal and provide an output indicative of the power level of the RF signal.

RF systems can include a plurality of RF couplers and a number of power detectors. Such RF systems can include circuitry configured to receive an output of an RF coupler and to provide a coupler signal to a power detector. In certain contexts, providing a coupler signal from an RF coupler to a power detector is becoming more complicated.

SUMMARY OF CERTAIN INVENTIVE ASPECTS

The innovations described in the claims each have several features, no single one of which is solely responsible for its desirable attributes. Without limiting the scope of the claims, some prominent features of this disclosure will now be briefly described.

One aspect of this disclosure is a radio frequency system with coupler circuits arranged in a daisy chain. The radio frequency system includes a first coupler circuit configured to receive a first signal from a first radio frequency coupler and a second coupler circuit configured to receive a second signal from a second radio frequency coupler. The first coupler circuit and the second coupler circuit are arranged in a daisy chain. The second coupler circuit includes a switch configured to turn on based on a signal level of a direct current component of a coupler signal from the first coupler and to pass a radio frequency component of the coupler signal when on.

A first packaged module can include the first coupler circuit and a second packaged module can include the second coupler circuit. The second coupler circuit can pass the coupler signal from the first coupler circuit while the second packaged module is otherwise inactive.

The radio frequency system can further include a power detector having an input coupled to an output of the daisy chain. The power detector can provide an indication of power of a single carrier of a carrier aggregated signal. A direct current blocking element can be coupled between the output of the daisy chain and the input of the power detector. The power detector can be included in a transceiver.

The radio frequency system can include a frequency multiplexing circuit configured to receive a first output signal from a first signal path that includes the first radio frequency coupler, to receive a second output signal from a second signal path that includes the second radio frequency coupler, and to provide a carrier aggregated signal.

The radio frequency system can further include a third coupler circuit arranged in the daisy chain.

The second coupler circuit can include a radio frequency signal path and a direct current signal path, in which the radio frequency signal path includes the switch. The direct current signal path can pass the direct current component of the coupler signal to the output port when the switch is on.

Another aspect of this disclosure is a radio frequency system with coupler circuits arranged in a daisy chain. The radio frequency system includes a first module and a second module. The first module includes a first coupler circuit configured to receive a first signal from a first radio frequency coupler. The second module includes a second coupler circuit configured to receive a second signal from a second radio frequency coupler. The first coupler circuit and the second coupler circuit are arranged in a daisy chain. The second coupler circuit is configured to pass a coupler signal from the first coupler circuit while the second module is otherwise inactive.

The radio frequency system can further include a power detector having an input coupled to an output of the daisy chain. The power detector can be configured to provide an indication of power of a single carrier of a carrier aggregated signal. The radio frequency system can further include a frequency multiplexing circuit configured to receive an output of the first module and an output of a third module, and to provide a carrier aggregated signal. The radio frequency system can further include a third coupler circuit arranged in the daisy chain.

Another aspect of this disclosure is a coupler circuit for passing a coupler signal. The coupler circuit includes an input port configured to receive an input signal having a direct current component and a radio frequency component, a radio frequency signal path including a switch configured to turn on based on the signal level of a direct current component of the input signal and to pass the radio frequency component of the input signal to an output port using the switch, and a direct current signal path configured to pass the direct current component of the input signal to the output port when the switch is on.

The radio frequency signal path can include a direct current blocking element coupled between the switch and the output port. The direct current blocking element can include a capacitor. The radio frequency signal path can receive an output from a radio frequency coupler at a node between the switch and the direct current blocking element. The radio frequency signal path can include another direct current blocking element coupled between the input port and the switch.

The coupler circuit can pass the direct current component and the radio frequency component to the output port when a module that includes the coupler circuit is otherwise inactive.

The direct current signal path can include a second switch and a radio frequency blocking circuit coupled between the second switch and the output port. The radio frequency blocking circuit can include an RC filter. The coupler circuit can include a third switch configured to provide a direct current signal to a node between the second switch and the radio frequency blocking circuit when the second switch is off. The coupler can further include another switch coupled to a control terminal of the second switch and configured to turn on responsive to the signal level of the direct current component of the input signal. The coupler circuit can include another radio frequency blocking circuit coupled between the second switch and the input port.

Another aspect of this disclosure is a wireless communication device that includes a first module, a second module, an antenna, and a power detector. The first module includes a first radio frequency coupler and first coupler circuit configured to receive a first signal from the first radio frequency coupler. The second module includes a second radio frequency coupler and a second coupler circuit configured to receive a second signal from the second radio frequency coupler. The first coupler circuit and the second coupler circuit are arranged in a daisy chain. The second coupler circuit includes a switch configured to turn on based on a signal level of a direct current component of a coupler signal from the first coupler circuit and to pass a radio frequency component of the coupler signal when on. The antenna is configured to transmit a carrier aggregated signal that includes a first carrier and a second carrier. The first carrier is provided by one of the first module or the second module. The power detector has an input coupled to an output of the daisy chain. The power detector is configured to provide an indication of power of the first carrier of the carrier aggregated signal.

The second coupler circuit can pass the coupler signal from the first coupler circuit while the second module is otherwise inactive.

The second coupler circuit can include a radio frequency signal path including a switch configured to turn on based on a signal level of a direct current component of the coupler signal and to pass a radio frequency component of the coupler signal to an output port when the switch is on. The second coupler circuit can include direct current signal path configured to pass the direct current component of the coupler signal to the output port when the switch is on.

The wireless communication device can further include a frequency multiplexing circuit configured to receive a first output signal from a first signal path associated with the first coupler circuit, to receive a second output signal from a second signal path associated with the second coupler circuit, and to provide the carrier aggregated signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
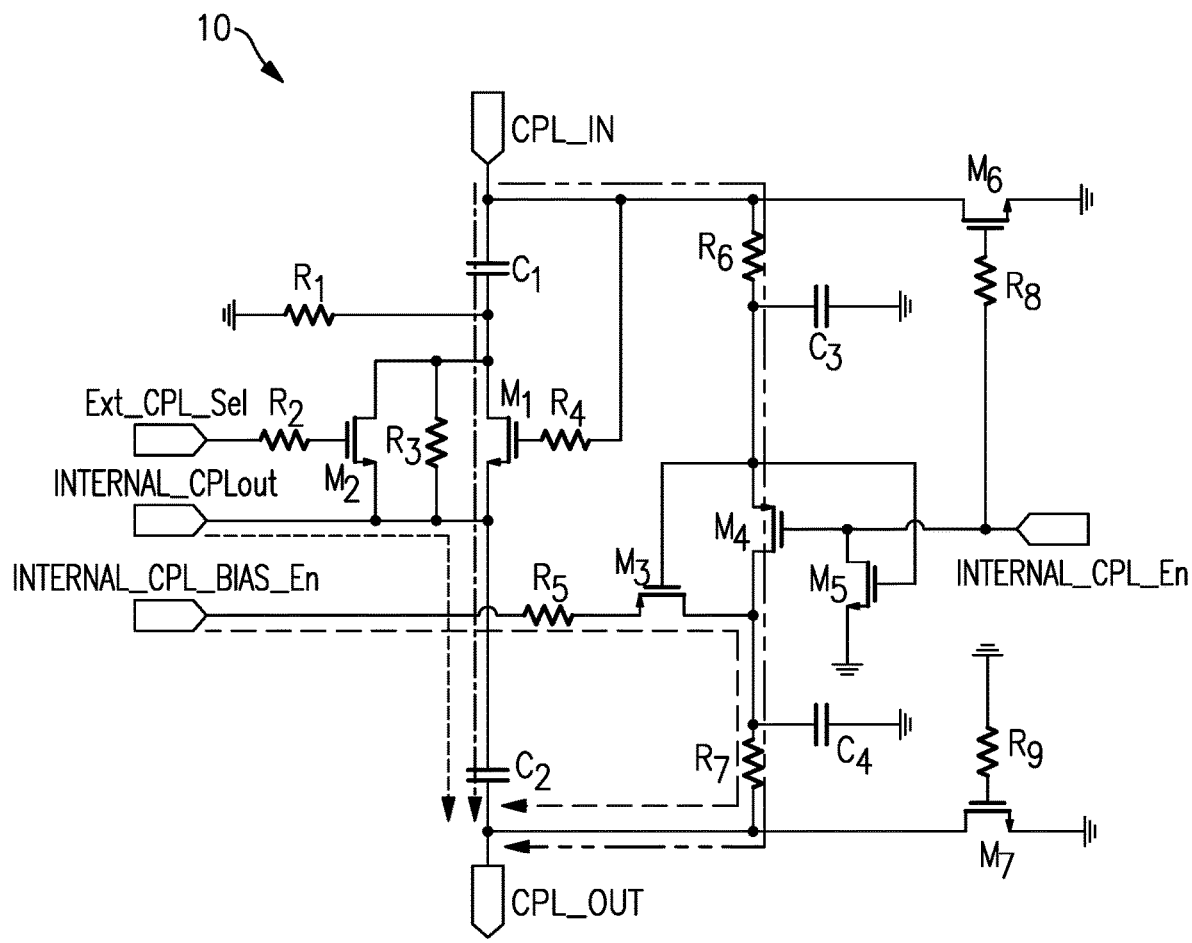
FIG. 1 is a schematic diagram of a coupler circuit according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

It can be desirable to detect power of a power amplifier in an RF front end. Power can be dynamically adjusted in a closed loop. Such dynamic power adjustment can be based on a distance from a base station, for example. With the advent of uplink carrier aggregation for fourth generation Long Term Evolution (4G LTE), multiple power detectors can be implemented in a transceiver to process coupled outputs from various power amplifiers. In a 2-uplink carrier aggregation case, 2 power detectors can be integrated into the transceiver to process the coupled signals from two power amplifiers that transmit simultaneously. To support multiple uplink carrier aggregation combinations (e.g., low band and high band, mid band and high band, etc.), coupler signal flow from power amplifiers to the transceiver has become more complicated. Using the daisy chain techniques discussed herein can enable detection of power associated with individual power amplifiers of various uplink carrier aggregation combinations.

Techniques discussed herein relate to a coupler signal propagating through a daisy-chain through active and/or inactive modules to a single output. For instance, techniques disclosed herein relate to a coupler signal propagating through coupler circuits arranged in a daisy chain to a single output, in which the coupler circuits include both a first coupler circuit on an active module and a second coupler circuit on an inactive module. By enabling the coupler signal to flow through one or more otherwise inactive modules, power consumption can be reduced and associated control can be simplified. Such techniques can be implemented without otherwise turning on and/or controlling any inactive modules that include circuitry that is part of the daisy chain.

Some previous attempts to process coupler signals from carrier aggregation systems involved controlling each of the modules that include a coupler circuit in a daisy chain using a serial bus, such as a MPIP RF Front End Interface (MIPI RFFE). However, these previous attempts increased overall power consumption by turning on inactive modules to allow a coupler signal to pass through the modules that would have otherwise been inactive. Moreover, such previous attempts involved additional complexity to keep track of the inactive modules in the daisy chain and turn them on as desired to pass the coupler signal.

Embodiments discussed herein can efficiently pass a coupler signal through an inactive module. This can reduce and/or minimize system power consumption associated with passing a coupler signal to a power detector. Embodiments discussed herein can simplify control of modules, as the coupler circuits discussed herein can pass a received coupler signal in an inactive module without any other control signals being toggled and/or provided to the inactive module.

FIG. 1 is a schematic diagram of a coupler circuit 10 according to an embodiment. The coupler circuit 10 can be implemented in each of a plurality of modules to enable a coupler signal to flow through both active and inactive modules. The coupler circuits in the plurality of modules can be arranged in a daisy chain. The coupler circuit 10 includes direct current (DC) blocking capacitors and RC filters to separate DC and radio frequency (RF) components at an input port CPL_IN and combine DC and RF components at an output port CPL_OUT. Additional circuitry in the DC path of the coupler circuit 10 can allow the DC signal component to flow from the input port CPL_IN to output port CPL_OUT only or to add a DC signal component to the output port CPL_OUT as desired.

As shown in FIG. 1, the coupler circuit 10 includes an input port CPL_IN, an output port CPL_OUT, an internal coupler signal port Internal_CPLout, an internal bias port Internal_CPL_Bias_En, an internal coupler enable port Internal_CPL_En, an external coupler select port Ext_CPL_Sel, switches $M_1$ to $M_7$, capacitors $C_1$ to $C_4$, and resistors $R_1$ to $R_9$. The coupler circuit 10 includes an RF path from the input port CPL_IN to the output port CPL_OUT. The coupler circuit 10 also includes a DC path from the input port CPL_IN to the output port CPL_OUT. The coupler circuit 10 includes an internal RF path from the internal coupler signal port Internal_CPLout to the output port CPL_OUT. The coupler circuit 10 also includes an internal DC path from the bias port Internal_CPL_Bias_En to the output port CPL_OUT. Any of the switches M1 to M7 can be implemented by any suitable switches. For example, the switches M1 to M7 can be field effect transistors as illustrated. In some other instances, one or more of the switches M1 to M7 can be implemented by another type of transistor or a microelectromechanical systems (MEMS) switch. Regardless of the technology, when a switch is turned on, it can pass a signal.

The input port CPL_IN can receive a coupler signal from an output port CPL_OUT of another coupler circuit. The output port CPL_OUT can provide a coupler signal from the coupler circuit 10 to an input port CPL_IN of a coupler circuit downstream in a daisy chain. The output port CPL_OUT can provide a coupler signal from the coupler circuit 10 to a power detector. The coupler signal at the output port CPL_OUT can have an RF signal component superimposed on a DC signal component.

The coupler signal received at the input power CPL_IN can have a DC component and an RF component. The DC component can activate the coupler circuit 10. Accordingly, the coupler circuit 10 can be referred to as a direct current controlled coupler circuit. In the illustrated coupler circuit 10, the DC component of a coupler signal received at the input port CPL_IN can turn on a switch M1 to pass the RF component of the coupler signal from the input port CPL_IN to the output port CPL_OUT. The RF component of the coupler signal can be an indication of power of an RF signal path. For example, the RF component can be a signal from a coupled out port of a radio frequency coupler. Illustrative examples of RF signal paths and RF couplers configured to provide the RF component of the coupler signal to the coupler circuit 10 are shown in FIGS. 7A to 7F.

Any of coupler circuits herein can receive a signal from any suitable radio frequency coupler including, for example, a directional coupler, a bi-directional coupler, a dual-directional coupler, a multi-band coupler (e.g., a dual-band coupler), etc. As an example, a radio frequency coupler can be a 4 terminal device having a power input port, a power output port, a coupled out port, and an isolated port. The radio frequency coupler can extract a portion of power of an RF signal propagating from the power input port to the power output port. The coupled out port can provide a portion of the power of an RF signal propagating from the power input port to the power output port. A termination impedance can be coupled to the isolated port.

The coupler circuit 10 includes an RF path from the input port CPL_IN to the output port CPL_OUT. The coupler circuit 10 can process an RF signal. Accordingly, the coupler circuit 10 can be referred to as an RF circuit. The RF path includes a first DC blocking capacitor $C_1$, a switch $M_1$, and a second DC blocking capacitor $C_2$. The first DC blocking capacitor $C_1$ can block a DC component of a coupler signal received at the input port CPL_IN. Accordingly, the switch $M_1$ can receive the RF signal component of the coupler signal received at the input port CPL_IN. A biasing element, such as resistor $R_1$, can set a DC voltage at a terminal of the switch $M_1$. When the switch $M_1$ is a field effect transistor, this can set a DC voltage at a drain and/or a source of the switch $M_1$. As illustrated, the switch $M_1$ is an n-type field effect transistor. The switch $M_1$ can turn on based on a signal level of the DC component of the coupler signal received at the input port CPL_IN. For example, when the DC component is asserted (i.e., at a logic 1 level in the illustrated coupler circuit 10), the switch $M_1$ can turn on and pass the RF component of the coupler signal received by way of the first blocking capacitor $C_1$. A resistor $R_4$ can be coupled between the input port CPL_IN and a control terminal of the switch $M_1$, which is a gate of a field effect transistor in FIG. 1.

The second DC blocking capacitor $C_2$ can block a DC component of an internal coupler signal provided to the internal coupler signal port Internal_CPLout of the coupler circuit 10. The internal coupler signal can be provided by a radio frequency coupler of a module that includes the coupler circuit 10. The internal coupler signal can be generated by the same module that includes the coupler circuit 10. By contrast, the coupler signal received at the input port CPL_IN is generated external to the module that includes the coupler circuit.

The coupler circuit 10 includes a DC path from the input port CPL_IN to the output port CPL_OUT. The DC path includes a first RC filter, a switch $M_4$, and second RF filter. In FIG. 1, the first RF filter includes a resistor $R_6$ and a capacitor $C_3$ arranged to filter the RF component of the coupler signal received at the input port CPL_IN. For example, the first RF filter can be a low pass filter configured to block the RF component of the coupler signal and to pass the DC component of the coupler signal. Such a low pass filter can have a corner frequency of, for example, about 30 megahertz (MHz). The switch $M_4$ can pass the DC component of the coupler signal when the coupler circuit 10 is passing the coupler signal from the input port CPL_IN to the output port CPL_OUT. The switch $M_4$ can be turned off when the coupler circuit 10 is providing a DC component of an internal DC signal from the internal bias port Internal_CPL_Bias_En to the output port CPL_OUT. The internal DC signal is provided by a module that includes the coupler circuit 10. The switch $M_4$ can be a p-type field effect transistor as illustrated.

Another switch $M_5$ can turn on the switch $M_4$ and/or maintain the switch $M_4$ in the on state responsive to a DC component of the coupler signal received at the input port CPL_IN being asserted (e.g., corresponding to a logic 1 level). The switch $M_5$ can enable the switch $M_4$ to turn off responsive to a signal at a control terminal of the switch $M_5$ when the DC component of the coupler signal received at the input port CPL_IN is de-asserted (e.g., corresponding to a logic 0 level). In FIG. 1, the second RC filter includes a resistor $R_7$ and a capacitor $C_4$ arranged to filter the RF component of the internal DC signal. The second RC filter can be a low pass filter configured to block RF components. Such a low pass filter can have a corner frequency of about 30 MHz, for example.

The coupler circuit 10 includes an internal RF path to the output port CPL_OUT. An internal coupler signal can be provided to an internal coupler signal port Internal_CPLout. The internal coupler signal port Internal_CPLout is connected to a node between the switch $M_1$ and the second DC blocking capacitor $C_2$. The internal coupler signal can be an indication of power of a signal in a transmission path, such as an output of a power amplifier or a signal downstream in a transmit path from a power amplifier. The internal coupler signal can be provided by a coupled out port of a radio frequency coupler, in which the radio frequency coupler and the coupler circuit 10 are included on the same module. The second DC blocking capacitor $C_2$ can block a DC component of the internal coupler signal.

The coupler circuit 10 includes an internal DC path from the internal bias port Internal_CPL_Bias_En to the output port CPL_OUT. An internal DC signal can be passed by switch $M_3$ to a node between switch $M_4$ and the second RC filter when the internal DC path is activated. The second RC filter can filter out any RF components of the internal DC signal. The switches $M_3$ and $M_4$ can together function as a pass gate in which the switch $M_3$ passes the internal DC signal and the switch $M_4$ passes the DC signal component of a coupler signal received at the input port CPL_IN. As illustrated, the switches $M_3$ and $M_4$ can both be implemented by p-type field effect transistors. An internal coupler enable signal received at an internal coupler enable port Internal_CPL_En can turn off the switch $M_4$ so as to enable the internal DC path. When the DC component of the coupler signal received at input port CPL_IN is at a logic 0 level in the illustrated coupler circuit 10, the switch $M_3$ can be on to pass the internal DC signal and the switches $M_4$ and $M_5$ can be off. Accordingly, the illustrated coupler circuit 10 can pass the internal DC signal to the output port CPL_OUT when the coupler signal received at the input port CPL_IN has a DC level corresponding to a logic 0 level.

The coupler circuit 10 is also compatible with a MIPI based externally controlled mode to pass a coupler signal. Accordingly, the illustrated coupler circuit 10 can operate in a DC biased mode in which a coupler signal is passed in a daisy chain based on a DC component level of a coupler signal or a MIPI based mode. In the MIPI based mode, an external coupler control signal can be provided to a switch $M_2$ to pass an RF component received at the input port CPL_IN. Resistors $R_2$ and $R_3$ can assist in achieving desired functionality in the MIPI based mode. The switch $M_2$ can be turned off and turned on responsive to a signal received at an external coupler select port Ext_CPL_Sel.

The coupler circuit 10 can also provide isolation and/or electrostatic discharge (ESD) protection. A shunt switch $M_6$ can provide isolation and/or ESD protection at the input port CPL_IN. The shunt switch $M_6$ can be on when the internal DC and RF paths are providing the DC and RF components at the output port CPL_OUT. A shunt switch $M_7$ can provide ESD protection at the output port CPL_OUT. The shunt switches $M_6$ and $M_7$ can receive signals at their control terminals by way of resistors $R_8$ and $R_9$, respectively.

Although the coupler circuit 10 may be described with signals having certain logic levels (e.g., logic 0 or logic 1), a coupler circuit can be implemented with one or more signals having a different (e.g., complementary) logic level. This can involve using transistors having different conductivity types, etc.

The coupler circuits discussed herein can be implemented in modules. A module can include circuitry included within a common package. Such a module can be referred to as a packaged module. A packaged module can include a semiconductor die and one or more passive components on a packaging substrate enclosed within a common package. Some such packaged modules can be multi-chip modules. The semiconductor die can be manufactured using any suitable process technology. As one example, the semiconductor die can be a semiconductor-on-insulator die, such as a silicon-on-insulator die. As another example, the semiconductor die can be a gallium arsenide die.

Figure 2:
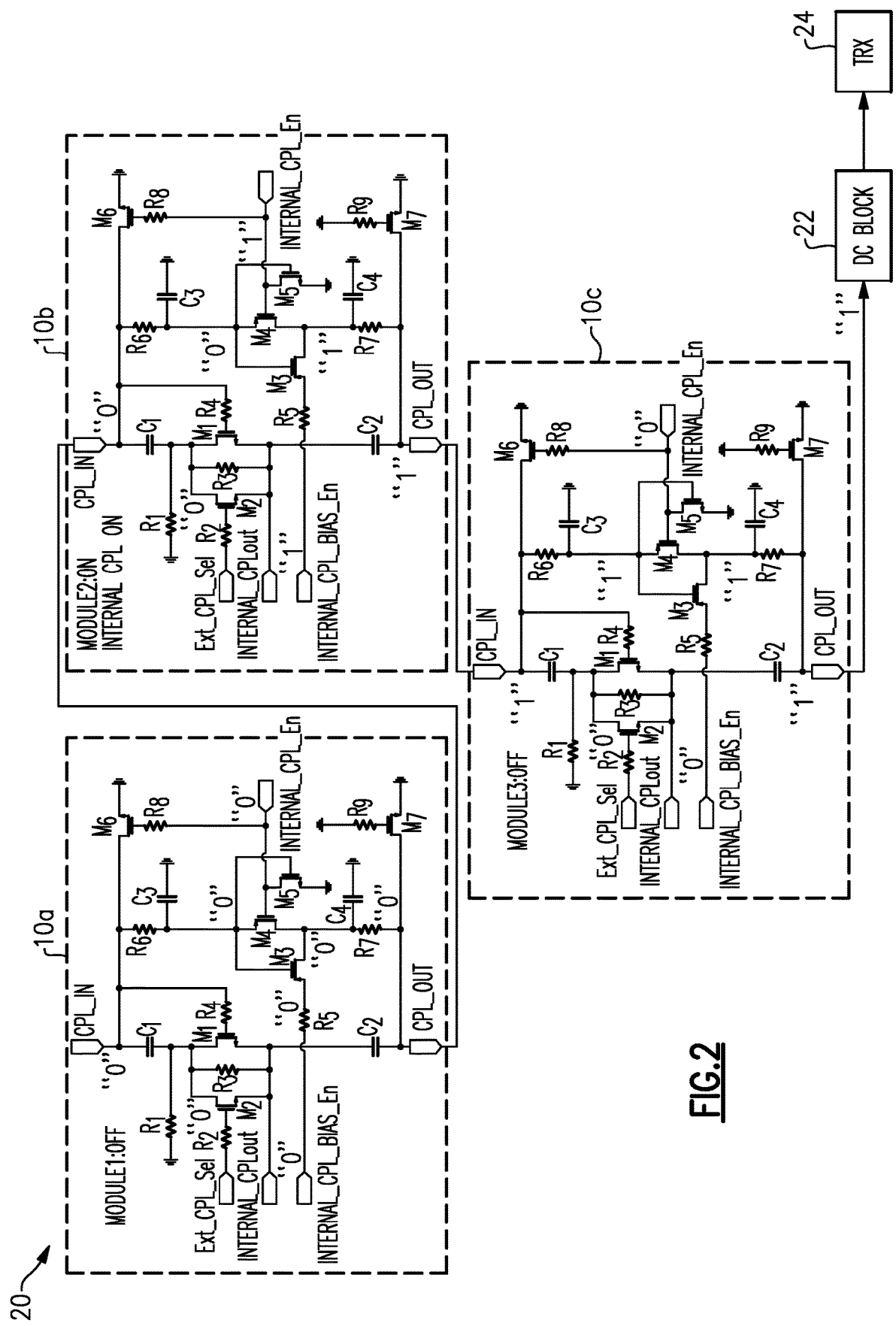
FIG. 2 is a schematic diagram of coupler circuits arranged in a daisy chain according to an embodiment.

FIG. 2 is a schematic diagram of a radio frequency system 20 in which coupler circuits 10a, 10b, and 10c are arranged in a daisy chain according to an embodiment. Each of the coupler circuits 10a, 10b, and 10c can implement the coupler circuit 10 of FIG. 1 in a different module. In particular, the coupler circuit 10a can be implemented in module 1, the coupler circuit 10b can be implemented in module 2, and the coupler circuit 10c can be implemented in module 3. As illustrated, each of the coupler circuits 10a, 10b, and 10c have the same circuit topology. This can provide flexibility in arranging the modules that include these coupler circuits in a daisy chain and/or including one of more of the coupler circuits in a different daisy chain arrangement with one or more coupler circuits from one or more other modules. Coupler circuits of different modules can be electrically connected to each other by way of contacts (e.g., pins, pads, etc.) of the modules. Only one of the coupler circuits 10a, 10b, and 10c can be receiving an internal coupler signal from an RF coupler at a time. A DC blocking element 22 can be coupled between an output of the daisy chain and a transceiver 24. The DC blocking element 22 can be a DC blocking capacitor arranged to block a DC component of the output of the daisy chain. A power detector of the transceiver 24 can receive the output of the daisy chain with the DC component stripped and provide an indication of power of a signal associated with a signal path of an active module. As shown in FIG. 2, modules 1 and 3 are inactive and module 2 is active. Accordingly, the power detector can provide an indication of power of a signal path of module 2 in a state corresponding to FIG. 2.

In FIG. 2, module 1 is inactive and the coupler circuit 10a can be inactive. The coupler circuit 10a of module 1 can provide a coupler signal to the coupler circuit 10b of module 2 that has a DC component corresponding to a signal level indicating that the coupler circuit 10a is not providing an indication of power from an RF coupler of module 1. For example, as illustrated, the coupler signal provided by module 1 to module 2 has a DC component with a logic 0 level.

In FIG. 2, module 2 is active. The coupler circuit 10b of module 2 can receive an internal coupler signal from an RF coupler. The coupler circuit 10b can also receive an internal DC signal. The internal coupler signal and the internal DC signal can be combined at the output port CPL_OUT of the coupler circuit 10b by way of an internal RF path and an internal DC path, respectively, of the coupler circuit 10b. The coupler circuit 10b can provide a coupler signal that has a DC component corresponding to a signal level indicating that the coupler 10b is providing an indication of power from an RF coupler of module 2. The coupler signal provided by the coupler signal 10b can also have an RF component corresponding to the indication of power from the RF coupler of module 2.

The coupler signal provided by the coupler circuit 10b to the coupler circuit 10c can activate the coupler circuit 10c. The coupler circuit 10c can be activated while module 3 is otherwise inactive. The DC component of the coupler signal from the coupler circuit 10b can activate an RF path of the coupler circuit 10c. As shown in FIG. 2, the switch $M_1$ of the RF path of the coupler circuit 10c can be turned on responsive to the DC component of the coupler signal provided by the coupler circuit 10b being at a logic 1 level. As also shown in FIG. 2, the switch $M_4$ of the DC path can be maintained on and/or turned on responsive to the DC component of the coupler signal provided by the coupler circuit 10b being at a logic 1 level. In the coupler circuit 10c, the switch $M_5$ can be turned on responsive to the coupler signal provided by the coupler circuit 10b being at a logic 1 level, which can consequently maintain the switch $M_4$ on and/or turn on the switch $M_4$. With the RF path and the DC path being active, the coupler signal from the coupler circuit 10b can be passed through the coupler circuit 10c. The coupler circuit can propagate from the output port CPL_OUT of the coupler circuit 10C to a power detector of the transceiver 24 by way of the DC blocking element 22.

While FIG. 2 illustrates three coupler circuits 10a, 10b, and 10c that include the same circuit topology, one or more of the coupler circuits in a daisy chain of coupler circuits can include a different circuit topology than one or more other circuits of the daisy chain. For example, a coupler circuit though which all other coupler circuits of the daisy chain are connected to a power detector can be implemented without a DC path in certain instances. In such instances, a DC blocking element can be omitted between an output of the daisy chain and a power detector. As another example, a coupler circuit that does not receive an input from another coupler circuit of the daisy chain can omit circuit elements for processing a coupler signal provided by another coupler circuit.

Figure 3:
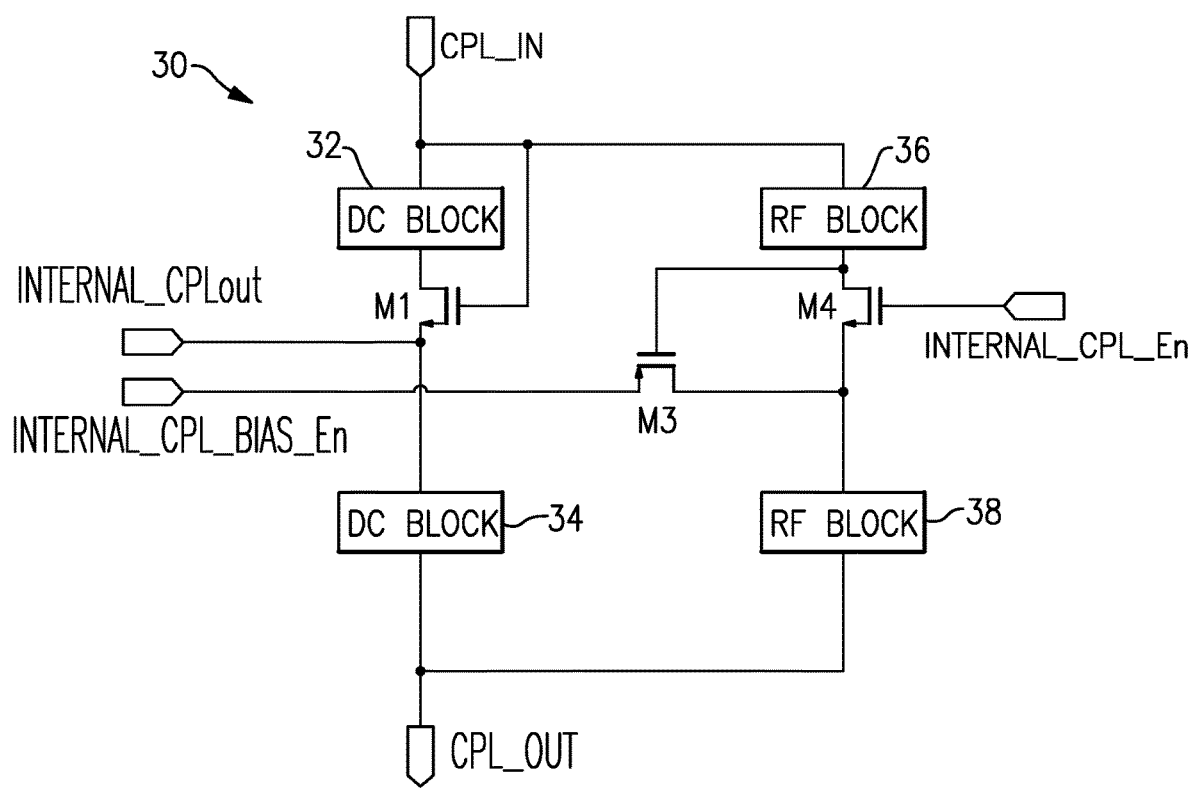
FIG. 3 is a schematic diagram of a coupler circuit according to an embodiment.

FIG. 3 is a schematic diagram of a coupler circuit 30 according to an embodiment. A plurality of coupler circuits 30 can be arranged in a daisy chain in accordance with any of the principles and advantages discussed herein. The coupler circuit 30 includes some features of the coupler circuit 10 of FIG. 1. The coupler circuit 30 can implement similar functionality as the coupler circuit 10.

The coupler circuit 30 includes an RF path from an input port CPL_IN to an output port CPL_OUT and a DC path from the input port CPL_IN to the output port CPL_OUT. The RF path can pass an RF component of a coupler signal received at the input port CPL_IN. The RF path includes a first DC blocking element 32, a switch $M_1$, and a second DC blocking element 34. The DC blocking element 32 can be any suitable circuit element(s), such as a capacitor, to block a DC component of the coupler signal received at the input port CPL_IN. The switch $M_1$ can turn on based on a signal level of the DC component of the coupler signal received at the input port CPL_IN.

The DC path of the coupler circuit 30 can pass the DC component of the coupler signal received at the input port CPL_IN. The DC path includes a first RF blocking element 36, a switch $M_4$, and a second RF blocking element 38. The RF blocking element 36 can be any suitable circuit element(s), such as a low pass filter, to block an RF component of the coupler signal received at the input port CPL_IN. The switch $M_4$ can be on when a module that includes the coupler circuit 30 is inactive. The switch $M_4$ can be on when an internal coupler signal port Internal_CPLout is not providing a coupled out signal from an RF coupler indicative of power in an RF signal path. The switch $M_4$ can be controlled based on a signal received at the internal coupler enable port Internal_CPL_En indicating whether the RF coupler is providing a coupled out signal indicative of RF power.

In the coupler circuit 30, an internal coupler signal can be received at the internal coupler signal port Internal_CPLout and provided to a node between the switch $M_1$ and the DC blocking element 34. An internal DC signal can be received at an internal bias port Internal_CPL_Bias_En and provided by way of the switch $M_3$ to a node between the switch $M_4$ and the RF blocking element 38.

Figure 4:
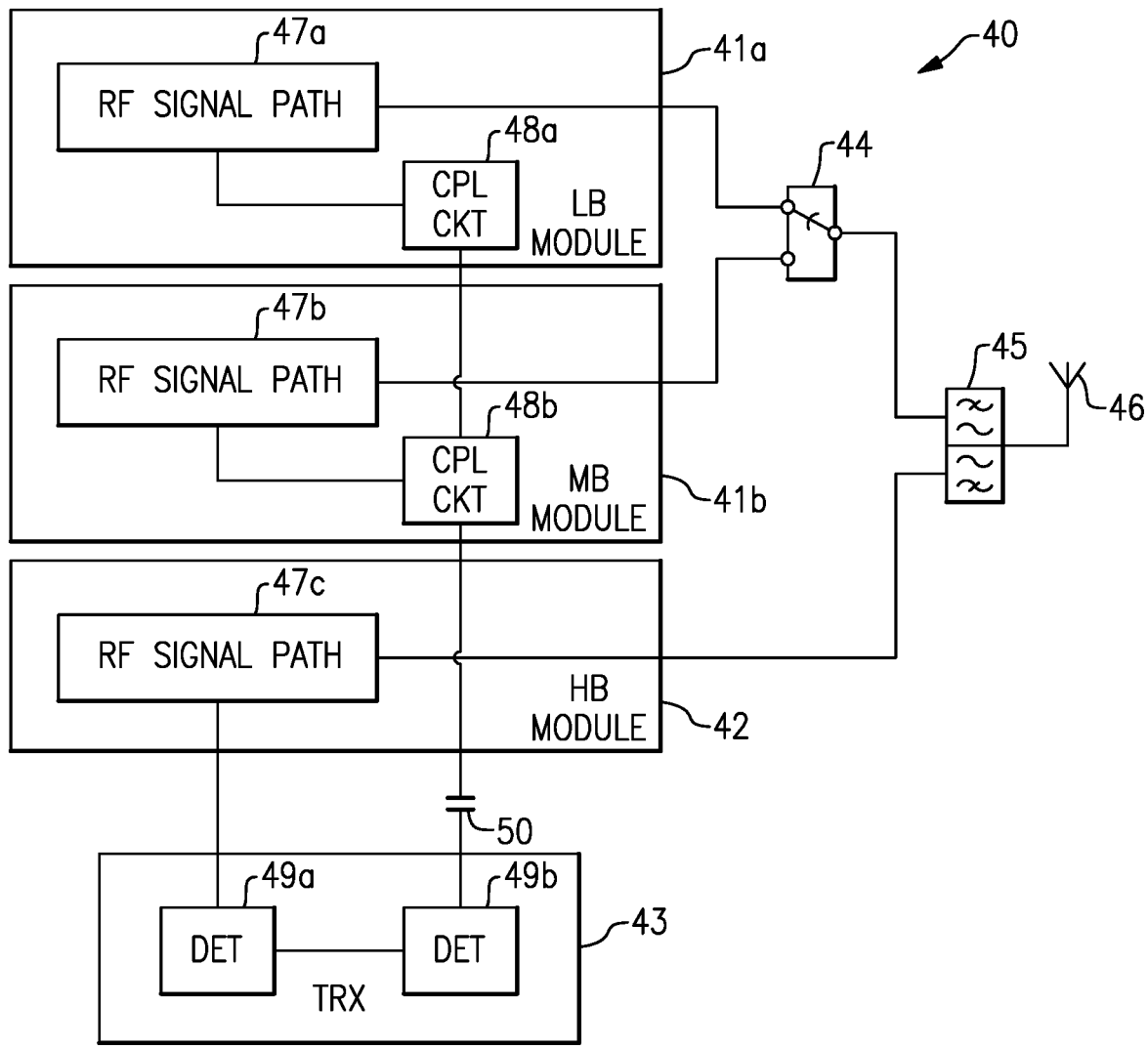
FIG. 4 is a schematic diagram of a radio frequency system with coupler circuits arranged in a daisy chain according to an embodiment.

FIG. 4 is a schematic diagram of a radio frequency system 40 with coupler circuits arranged in a daisy chain according to an embodiment. The RF system 40 can transmit a carrier aggregated signal. Accordingly, the RF system 40 can be referred to as a carrier aggregation system.

As illustrated, the RF system 40 includes a first module 41A, a second module 41B, a third module 42, a transceiver 43, an RF switch 44, a diplexer 45, and an antenna 46. The modules 41A, 41B, and 42 each include an RF signal path 47A, 47B, and 47C, respectively. The modules 41A and 41B each include a coupler circuit 48A and 48B, respectively. The coupler circuits 48A and 48B can be implemented in accordance with any suitable principles and advantages discussed herein. For example, the coupler circuit 48A can be implemented by the coupler circuit 10 of FIG. 1 or the coupler circuit 30 of FIG. 3. The modules 41A, 41B, 42 can each provide an RF signal as an output. The RF switch 44 can selectively electrically couple an output of the first module 41A or an output of the second module 41B to the diplexer 45. The diplexer 45 can frequency multiplex an output signal from the RF switch 44 with the output signal from the third module 42 to generate a carrier aggregated signal. The carrier aggregated signal can be transmitted by the antenna 46.

In the RF system 40, the first module 41A can be a low band module, the second module 41B can be a mid band module, and the third module 42 can be a high band module. A carrier aggregated signal transmitted by the antenna 46 can include either (1) a low band carrier and a high band carrier, or (2) a mid band carrier and a high band carrier. Accordingly, only two of the modules 41A, 41B, and 42 can be active at the same time. In this example, only one of the first module 41A or the second module 41B can be active at time. Since the first module 41A and the second module 41B are not transmitting at the same time, one of these modules can be active and the other module can be inactive.

The coupler circuits 48A and 48B of the first module 41A and the second module 41B, respectively, are arranged in a daisy chain. Only one of the coupler circuits 48A or 48B can receive an internal coupler signal that is indicative of power of a carrier being transmitted by the antenna 46 from a respective RF signal path 47A or 47B. The coupler signal can be provided to a power detector 49B of the transceiver 43 to detect power associated with the carrier. A DC blocking capacitor 50 can be coupled between the daisy chain of coupler circuits and the power detector 49B to block a DC signal component.

As illustrated, the transceiver 43 includes a first power detector 49A and a second power detector 49B. The first power detector 49A can detect a power associated with a carrier of the third module 42. The second power detector 49B can detect a power of a carrier associated with either the first module 41A or the second module 41B depending on which of these modules is active. The transceiver 43 can process outputs of the power detectors and send feedback signals to respective modules 41A, 41B, and 42 to adjust power based on the detected power levels.

Figure 5:
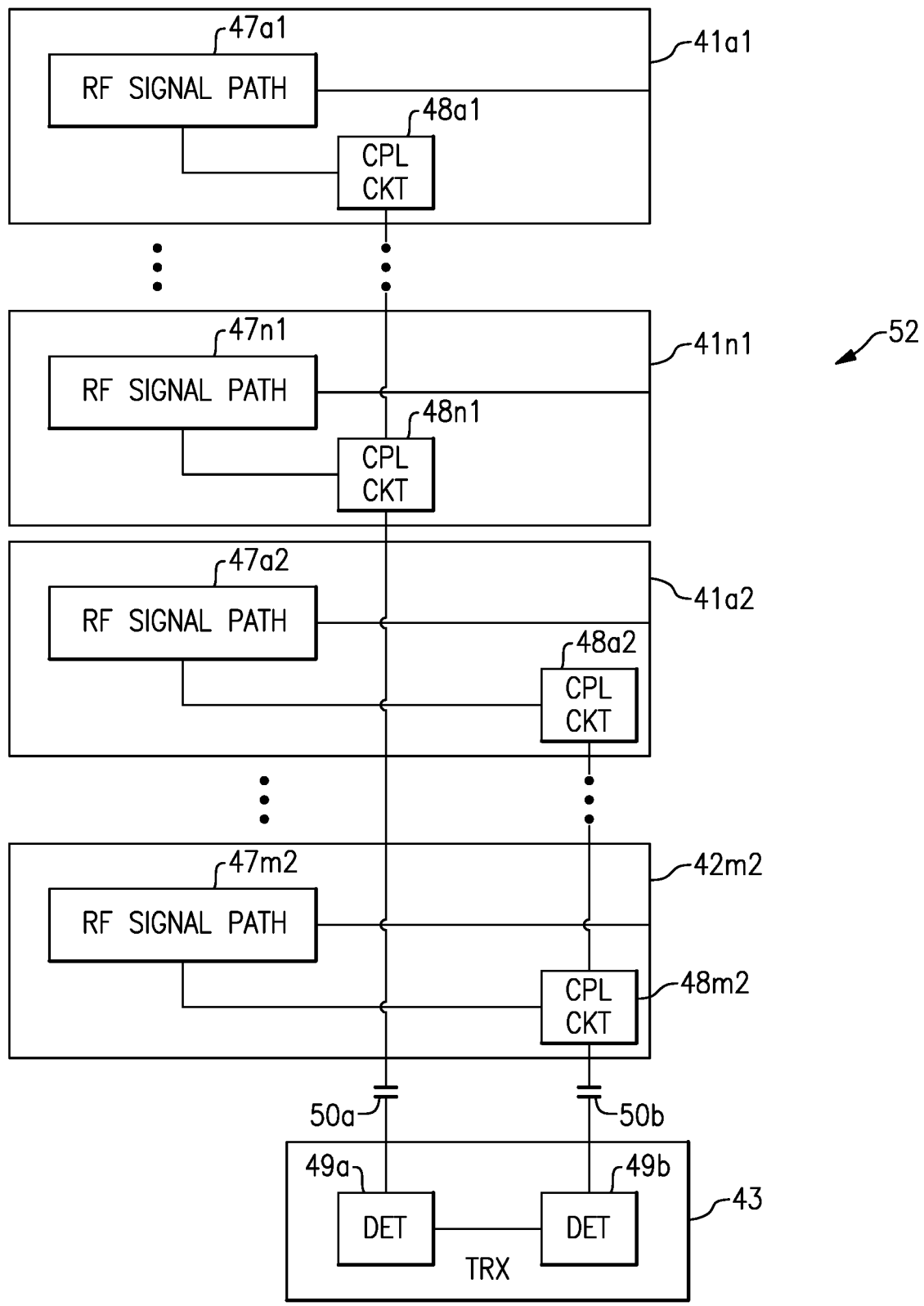
FIG. 5 is a schematic diagram of a radio frequency system with coupler circuits arranged in a daisy chain according to another embodiment.

FIG. 5 is a schematic diagram of a radio frequency system 52 with coupler circuits arranged in a daisy chain according to another embodiment. The radio frequency system 52 includes a first group of modules 41A1 to 41N1 having coupler circuits 48A1 to 48N1, respectively, arranged in a daisy chain and a second group of modules 41A2 to 41M2 having coupler circuits 48A2 to 48M2, arranged in another daisy chain. The coupler circuits of the radio frequency system 52 can be implemented in accordance with any suitable principles and advantages discussed herein. For example, any of the illustrated coupler circuits can be implemented by the coupler circuit 10 of FIG. 1 or the coupler circuit 30 of FIG. 3. Any suitable number of coupler circuits can be arranged in a daisy chain in accordance with any of the principles and advantages discussed herein. Each daisy chain can include coupler circuits in which only one coupler circuit is arranged to receive an internal coupler signal at a time and the remaining coupler circuits are either inactive or arranged to pass the coupler signal from the one coupler signal that is receiving the internal coupler signal. Any suitable number of daisy chained coupler circuits can be implemented in a radio frequency system. In the RF system 52, the transceiver 43 includes power detectors 49A and 49B each arranged to receive an output of a different daisy chain. DC blocking capacitors 50A and 50B can be coupled between outputs of respective daisy chains and respective detectors 49A and 49B.

Figure 6:
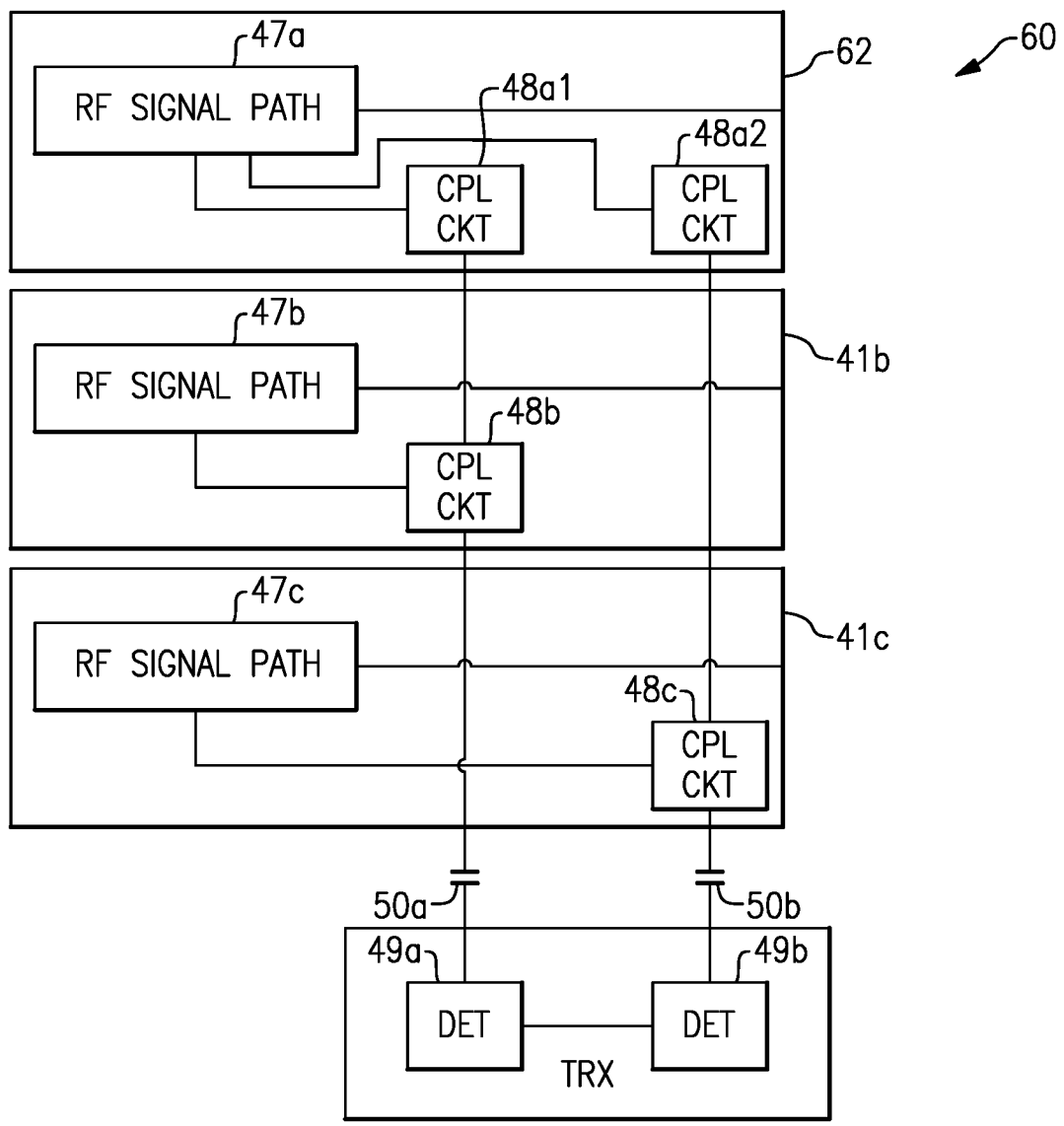
FIG. 6 is a schematic diagram of a radio frequency system with coupler circuits arranged in a daisy chain according to another embodiment.

FIG. 6 is a schematic diagram of a radio frequency system 60 with coupler circuits arranged in a daisy chain according to another embodiment. The RF system 60 illustrates that a module 62 can include multiple coupler circuits 48A1 and 48A2 included in different daisy chains of coupler circuits. The RF signal path 47A of module 62 can include a first portion that is active when the module 41C is active and a second portion that is active when the module 41B is active. The first portion of the RF signal path 47A can include a first RF coupler having a coupled out port configured to provide an internal coupler signal to a first coupler circuit 48A1. The second portion of the RF signal path 47A can include a second RF coupler having a coupled out port configured to provide an internal coupler signal to a second coupler circuit 48A2. Accordingly, each of the daisy chains illustrated in FIG. 6 can have no more than one coupler circuit arranged to receive an internal coupler signal at a time.

FIGS. 7A to 7F are schematic diagrams of radio frequency systems with a coupler circuit according to various embodiments. Different modules that include coupler circuits arranged in a daisy chain can include RF signal paths that include one or more features of the RF systems of FIGS. 7A to 7F. The RF signal paths of different modules can include different RF signal paths and/or similar RF signal paths. The RF systems of FIGS. 7A to 7F include illustrative examples of RF signal paths that can be implemented in any suitable RF signal path of FIGS. 4 to 6. The RF systems of FIGS. 7A to 7F illustrate example systems in which a coupler circuit 48 can be implemented. The coupler circuit 48 can be implemented in accordance with any suitable principles and advantages of any of the coupler circuits discussed herein, such as the coupler circuit 10 of FIG. 1 and/or the coupler circuit 30 of FIG. 3. Moreover, any suitable combination of features of the illustrative RF systems of FIGS. 7A to 7F can be implemented with each other. In each of the illustrative RF systems of FIGS. 7A to 7F, an indication of power associated with an amplified RF signal provided by a power amplifier in a transit path can be provide to a coupler circuit.

Figure 7A:
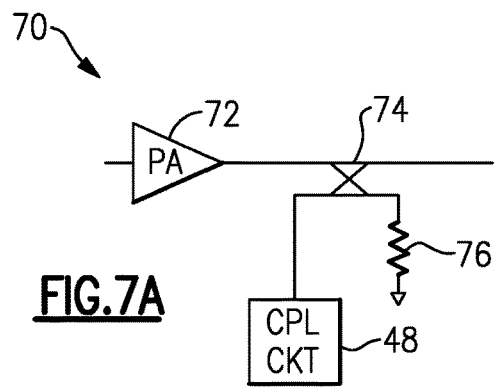
FIG. 7A is a schematic diagram of radio frequency system with a coupler circuit according to an embodiment.

FIG. 7A is a schematic diagram of an RF system 70 that includes a power amplifier 72 configured to amplify an RF signal and an RF coupler 74 coupled to an output of the power amplifier 72. The illustrated RF coupler 74 can be referred to as a directional coupler. The RF coupler 74 has a termination impedance 76 (e.g., a termination resistor) coupled to a terminate port. The RF coupler 74 is arranged to provide an indication of power of an amplified RF signal provided by the power amplifier 72 at a coupled out port. The coupler circuit 48 is arranged to receive the indication of power of the amplified RF signal as an internal coupler signal. The internal coupler signal can be provided to an internal RF path of the coupler circuit 48. For instance, the internal coupler signal can be provided to a port corresponding to the internal coupler signal port Internal_CPLout of the coupler circuit 10 of FIG. 1.

Figure 7B:
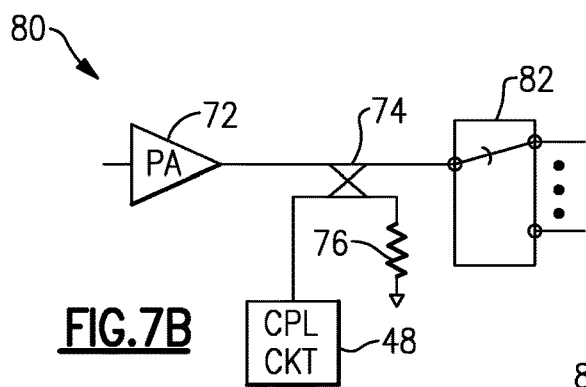
FIG. 7B is a schematic diagram of radio frequency system with a coupler circuit according to another embodiment.

FIG. 7B is a schematic diagram of an RF system 80 that includes an RF coupler 74 coupled in a signal path between a power amplifier 72 and an RF switch 82. The illustrated RF switch 82 is a multi-throw switch, such as a band select switch. As illustrated, the RF coupler 74 is coupled between an output of the power amplifier 72 and a common port of the RF switch 74.

Figure 7C:
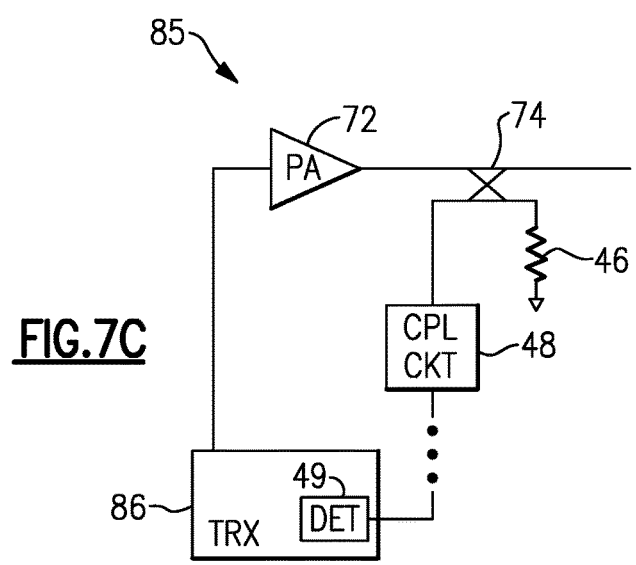
FIG. 7C is a schematic diagram of radio frequency system with a coupler circuit according to another embodiment.

FIG. 7C is a schematic diagram of an RF system 85 that illustrates a closed loop that can adjust power of an amplified RF signal provided by the power amplifier 72. The closed loop can include coupler circuits arranged in a daisy chain and a power detector 49 arranged to receive an output of the daisy chain. An input to the power amplifier 72 can be adjusted based on a detected power level detected by the power detector 49. A signal provided to the power amplifier 72 by the transceiver 86 can be adjusted based on an output of the power detector 49.

Figure 7D:
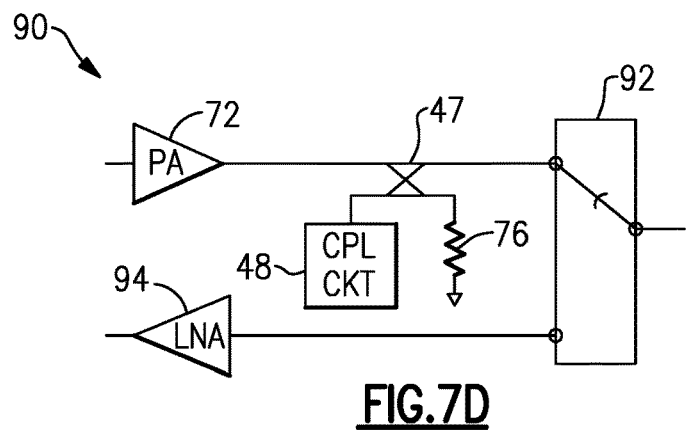
FIG. 7D is a schematic diagram of radio frequency system with a coupler circuit according to another embodiment.

FIG. 7D is a schematic diagram of an RF system 90 that includes an RF coupler 74 coupled in a signal path between a power amplifier 72 and a transmit/receive switch 92. The transmit/receive switch 92 can selectively electrically couple the power amplifier 72 or a low noise amplifier 94 to a common port of the transmit/receive switch 92.

Figure 7E:
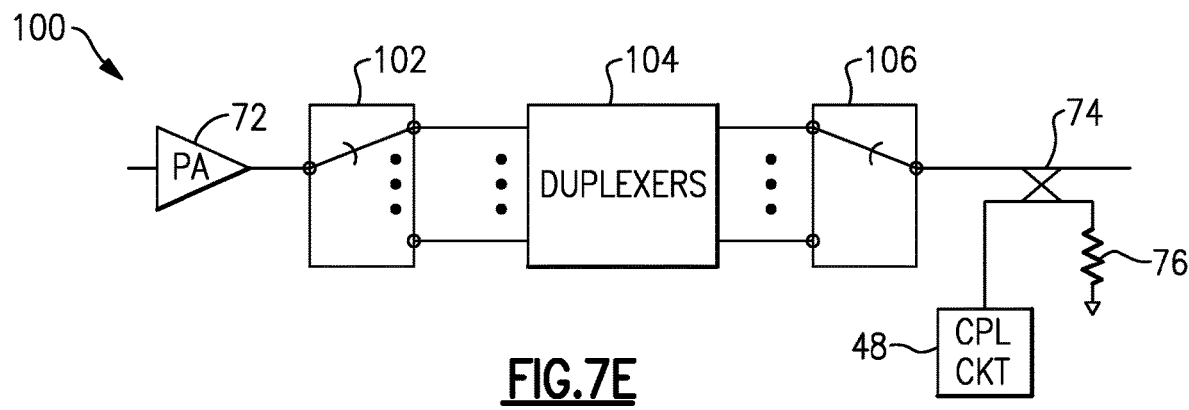
FIG. 7E is a schematic diagram of radio frequency system with a coupler circuit according to another embodiment.

FIG. 7E is a schematic diagram of an RF system 100 that includes RF switches 102 and 106 and duplexers 104 coupled between a power amplifier 72 and an RF coupler 74. The various paths between an output of the power amplifier 72 and a common port of the RF switch 106 that is connected to the RF coupler 74 can include filtering and/or other processing that is tailored for amplifying particular RF signals.

Figure 7F:
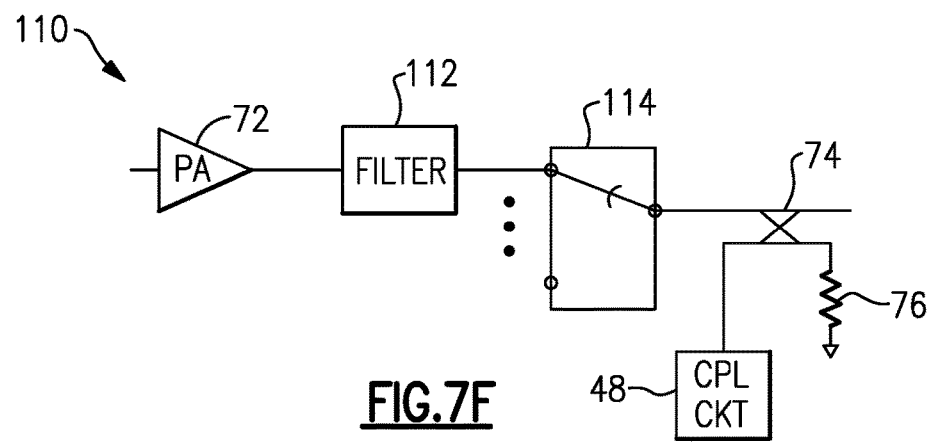
FIG. 7F is a schematic diagram of radio frequency system with a coupler circuit according to another embodiment.

FIG. 7F is a schematic diagram of an RF system 110 that includes a filter 112 and an RF switch 114 coupled in s signal path between the power amplifier 72 and the RF coupler 74.

Figure 8:
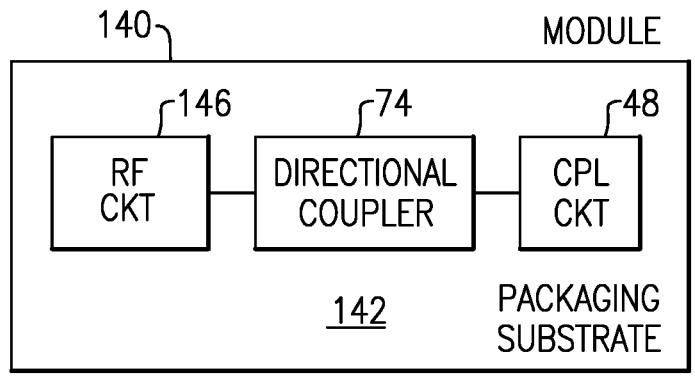
FIG. 8 is a block diagram of a packaged module that includes a coupler circuit according to an embodiment.

FIG. 8 is a block diagram of a packaged module 140 that includes a coupler circuit according to an embodiment. The illustrated packaged module 140 includes a packaging substrate 142, an RF circuit 146, an RF coupler 74, and a coupler circuit 48. The packaging substrate 142 can be a laminate substrate, for example. The RF circuit 146, the RF coupler 74, and the coupler circuit 48 can be disposed on the packaging substrate 142. The RF circuit 146 can be any suitable circuit configured to provide an RF signal, such as a circuit that includes a power amplifier. The coupler circuit 48 of the module 140 can be arranged in a daisy chain with one or more other coupler circuits in accordance with any of the principles and advantages discussed herein.

Figure 9:
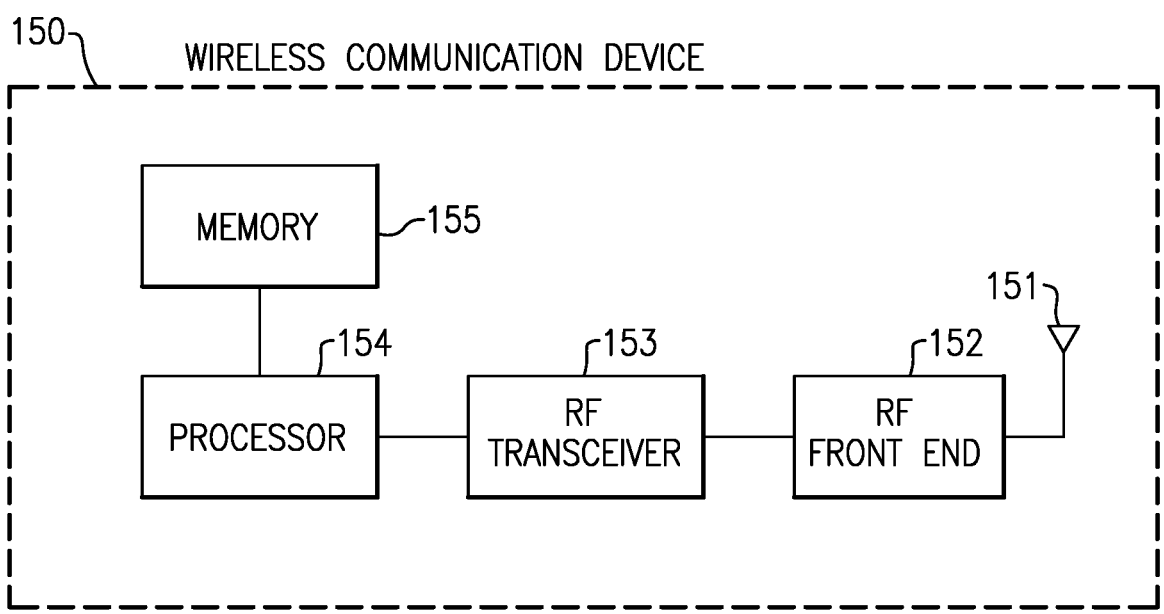
FIG. 9 is a block diagram of a wireless communication device that includes a coupler circuit according to an embodiment.

FIG. 9 is a block diagram of a wireless communication device 150 that includes coupler circuits arranged in a daisy chain according to an embodiment. The wireless communication device 150 can be any suitable wireless communication device. For instance, a wireless communication device 150 can be a mobile phone, such as a smart phone. As illustrated, the wireless communication device 150 includes an antenna 151, an RF front end 152, a transceiver 153, a processor 154, and a memory 155. The antenna 151 can transmit RF signals provided by the RF front end 152. The antenna 151 can transmit carrier aggregated signals provided by the RF front end 152. The antenna 151 can provide received RF signals to the RF front end 152 for processing.

The RF front end 152 can include one or more power amplifiers, one or more low noise amplifiers, RF switches, receive filters, transmit filters, duplex filters, or any combination thereof. The RF front end 152 can transmit and receive RF signals associated with any suitable communication standards. For instance, the RF front end 152 can provide a carrier aggregated signal to the antenna 151. RF signal paths discussed herein can be implemented in the RF front end 152. The RF front end 152 can include coupler circuits arranged in a daisy chain.

The RF transceiver 153 can provide RF signals to the RF front end 152 for amplification and/or other processing. The RF transceiver 153 can also process an RF signal provided by a low noise amplifier of the RF front end 152. The RF transceiver 153 can include one or more power detectors arranged to receive an output of a daisy chain of coupler circuits. The RF transceiver 153 can include one or more power detectors arranged to receive an output of a daisy chain of coupler circuits. The RF transceiver 153 can provide one or more signals to a transmit path to adjust power of a carrier based on an output of a power detector arranged to receive an output of a daisy chain of coupler circuits.

The RF transceiver 153 is in communication with the processor 154. The processor 154 can be a baseband processor. The processor 154 can provide any suitable base band processing functions for the wireless communication device 150. The memory 155 can be accessed by the processor 154. The memory 155 can store any suitable data for the wireless communication device 150.

Any of the principles and advantages discussed herein can be applied to other systems, not just to the systems described above. The elements and operations of the various embodiments described above can be combined to provide further embodiments. Some of the embodiments described above have provided examples in connection with power amplifiers and/or wireless communications devices. However, the principles and advantages of the embodiments can be used in connection with any other systems, apparatus, or methods that benefit could from any of the teachings herein. For instance, any of the principles and advantages discussed herein can be implemented in connection with detecting power from one of a plurality of different signal paths of which only one is active at a time. Any of the principles and advantages discussed herein can be implemented in association with RF circuits configured to process signals in a range from about 30 kilohertz (kHz) to 300 gigahertz (GHz), such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A radio frequency module comprising:
   input port configured to receive an input signal having a direct current component and a radio frequency component;
   an output port;
   a radio frequency coupler configured to provide an indication of radio frequency power; and
   a coupler circuit including a switch and a direct current blocking element, the switch configured to turn on based on a signal level of the direct current component of the input signal and to pass the radio frequency component of the input signal when on, the direct current blocking element being coupled between the switch and the output port, and the coupler circuit configured to receive the indication of radio frequency power at a node between the switch and the direct current blocking element.

2. The radio frequency module of claim 1 wherein the coupler circuit is configured to pass the direct current component and the radio frequency component to the output port when the radio frequency module is otherwise inactive.

3. The radio frequency module of claim 1 wherein the coupler circuit includes another direct current blocking element coupled between the input port and the switch.

4. The radio frequency module of claim 1 wherein the coupler circuit includes a direct current signal path configured to pass the direct current component of the input signal to the output port when the switch is on.

5. The radio frequency module of claim 4 wherein the direct current signal path includes a second switch and a radio frequency blocking circuit coupled between the second switch and the output port.

6. The radio frequency module of claim 5 wherein the coupler circuit further includes a third switch configured to provide a direct current signal to a node between the second switch and the radio frequency blocking circuit when the second switch is off.

7. The radio frequency module of claim 5 wherein the coupler circuit further includes another switch coupled to a control terminal of the second switch and configured to turn on responsive to the signal level of the direct current component of the input signal.

8. The radio frequency module of claim 1 further comprising a power amplifier coupled to the radio frequency coupler, the indication of radio frequency power being an indication of output power of the power amplifier.

9. A radio frequency system with coupler circuits, the radio frequency system comprising:
   a first packaged module including a first radio frequency coupler and a first coupler circuit arranged to receive an output signal from the first radio frequency coupler, the first coupler circuit configured to provide a coupler signal having a direct current component and a radio frequency component; and
   a second packaged module including an input port configured to receive the coupler signal; an output port; a second radio frequency coupler configured to provide an indication of radio frequency power; and a second coupler circuit including a switch and a direct current blocking element, the switch configured to turn on based on a signal level of the direct current component of the coupler signal and to pass the radio frequency component of the coupler signal when on, the direct current blocking element being coupled between the switch and the output port, and the second coupler circuit configured to receive the indication of radio frequency power at a node between the switch and the direct current blocking element.

10. The radio frequency system of claim 9 wherein the second coupler circuit is configured to pass the direct current component of the coupler signal and the radio frequency component of the coupler signal to the output port when the second packaged module is otherwise inactive.

11. The radio frequency system of claim 9 wherein the second coupler circuit includes a direct current signal path configured to pass the direct current component of the coupler signal to the output port when the switch is on.

12. The radio frequency system of claim 9 wherein the second packaged module further includes a power amplifier coupled to the second radio frequency coupler, the indication of radio frequency power being an indication of output power of the power amplifier.

13. The radio frequency system of claim 9 further comprising a power detector having an input coupled to the output port of the second packaged module.

14. The radio frequency system of claim 13 wherein power detector is configured to provide an indication of power of a single carrier of a carrier aggregated signal.

15. The radio frequency system of claim 9 further comprising a third packaged module that includes a third coupler circuit having an input coupled to the output port of the second packaged module.

16. A method for providing an indication of radio frequency power, the method comprising:
   receiving a coupler signal from a first coupler circuit at an input port of a second coupler circuit, the coupler signal having a direct current component and a radio frequency component;
   turning on a switch of the second coupler circuit responsive to a signal level of the direct current component of the coupler signal; and while the switch is on, passing the radio frequency component of the coupler signal to an output port of the second coupler circuit using the switch.

17. The method for claim 16 further comprising passing the direct current component of the coupler signal to the output port while the switch is on.

18. The method for claim 17 wherein a radio frequency module that includes the second coupler circuit is otherwise inactive while the second coupler circuit passes the radio frequency and direct current components of the coupler signal to the output port.

19. The method for claim 16 further comprising:
receiving a signal from a radio frequency coupler at a node between the switch and the output port of the second coupler circuit while the switch is off; and
providing a radio frequency component of the signal from the radio frequency coupler to the output port.

20. The method for claim 19 further comprising providing an internal direct current signal to the output port such that the internal direct current signal is superimposed on the radio frequency component of the signal from the radio frequency coupler.

\* \* \* \* \*